(12) United States Patent  
Bash et al.

(10) Patent No.: US 7,669,431 B2
(45) Date of Patent: Mar. 2, 2010

(54) COOLING PROVISIONING FOR HEAT GENERATING DEVICES

(75) Inventors: Cullen E. Bash, San Francisco, CA (US); Chandrakant D. Patel, Fremont, CA (US); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1151 days.

(21) Appl. No.: 11/101,238

(22) Filed: Apr. 7, 2005

(65) Prior Publication Data

US 2006/0225446 A1 Oct. 12, 2006

(51) Int. Cl.
*F25D 17/00* (2006.01)
*F25D 23/12* (2006.01)
*F28D 15/00* (2006.01)

(52) U.S. Cl. ............... 62/178; 62/259.2; 165/104.33
(58) Field of Classification Search ............ 62/178, 62/259.2, 263; 165/104.33; 236/49.3
See application file for complete search history.

(56) References Cited

U.S. PATENT DOCUMENTS

| | | | |
|---|---|---|---|
| 6,283,380 B1 * | 9/2001 | Nakanishi et al. | 236/49.3 |
| 6,374,627 B1 * | 4/2002 | Schumacher et al. | 62/259.2 |
| 6,574,104 B2 * | 6/2003 | Patel et al. | 361/695 |
| 6,854,659 B2 * | 2/2005 | Stahl et al. | 236/49.3 |
| 6,868,682 B2 * | 3/2005 | Sharma et al. | 62/180 |
| 7,251,547 B2 * | 7/2007 | Bash et al. | 700/276 |
| 7,286,351 B2 * | 10/2007 | Campbell et al. | 361/696 |
| 2006/0075764 A1 * | 4/2006 | Bash et al. | 62/178 |
| 2006/0080001 A1 * | 4/2006 | Bash et al. | 700/276 |
| 2006/0091229 A1 * | 5/2006 | Bash et al. | 236/49.3 |

FOREIGN PATENT DOCUMENTS

| | | | |
|---|---|---|---|
| JP | 2000241002 A | * | 9/2000 |
| JP | 2004293947 A | * | 10/2004 |

* cited by examiner

*Primary Examiner*—Chen-Wen Jiang

(57) ABSTRACT

A method for controlling cooling provisioning for heat generating devices includes correlating the heat generating devices with primary actuators, such that the heat generating devices are associated with primary actuators having at least a predefined level of influence over the respective heat generating devices. The flow rates of air supplied by the primary actuators are set based upon volume flow rate requirements of the heat generating devices, such that the volume flow rate setting for a primary actuator is based upon the volume flow rate requirement for the heat generating devices associated with the primary actuator. In addition, the temperatures of the airflow supplied by the primary actuators are varied to substantially maintain associated heat generating devices within predetermined temperature ranges.

24 Claims, 7 Drawing Sheets

COOLING PROVISIONING FOR HEAT GENERATING DEVICES

BACKGROUND

A data center may be defined as a location, for instance, a room that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system containing multiple microprocessors dissipates approximately 250 W of power. Thus, a rack containing forty (40) computer systems of this type dissipates approximately 10 KW of power.

Current approaches to provisioning cooling to dissipate the heat generated by the cooling systems are typically based upon temperatures detected at the inlets of air conditioning units. Oftentimes, however, the temperatures detected at the air conditioning unit inlets are not an accurate reflection of the temperatures of the computer systems being cooled. In many instances, therefore, the provisioning of the cooling is based on the nameplate power ratings of all of the computer systems in the data center, with some slack for risk tolerance. This type of cooling provisioning oftentimes leads to excessive and inefficient cooling solutions. This problem is further exacerbated by the fact that in most data centers, the cooling is provisioned for worst-case or peak load scenarios. Since it is estimated that typical data center operations only utilize a fraction of the servers, provisioning for these types of scenarios often increases the inefficiencies found in conventional cooling arrangements.

As such, it would be beneficial to have thermal management that more effectively and efficiently utilizes the air conditioning units in data centers.

SUMMARY

A method for controlling cooling provisioning for heat generating devices is disclosed herein. In the method, the heat generating devices are correlated with primary actuators, such that the heat generating devices are associated with primary actuators having at least a predefined level of influence over the respective heat generating devices. The flow rates of air supplied by the primary actuators are set based upon volume flow rate requirements of the heat generating devices, such that the volume flow rate setting for a primary actuator is based upon the volume flow rate requirement for the heat generating devices associated with the primary actuator. In addition, the temperatures of the airflow supplied by the primary actuators are varied to substantially maintain associated heat generating devices within predetermined temperature ranges.

BRIEF DESCRIPTION OF THE DRAWINGS

Features of the present invention will become apparent to those skilled in the art from the following description with reference to the figures, in which.

DETAILED DESCRIPTION

Figure 1A:
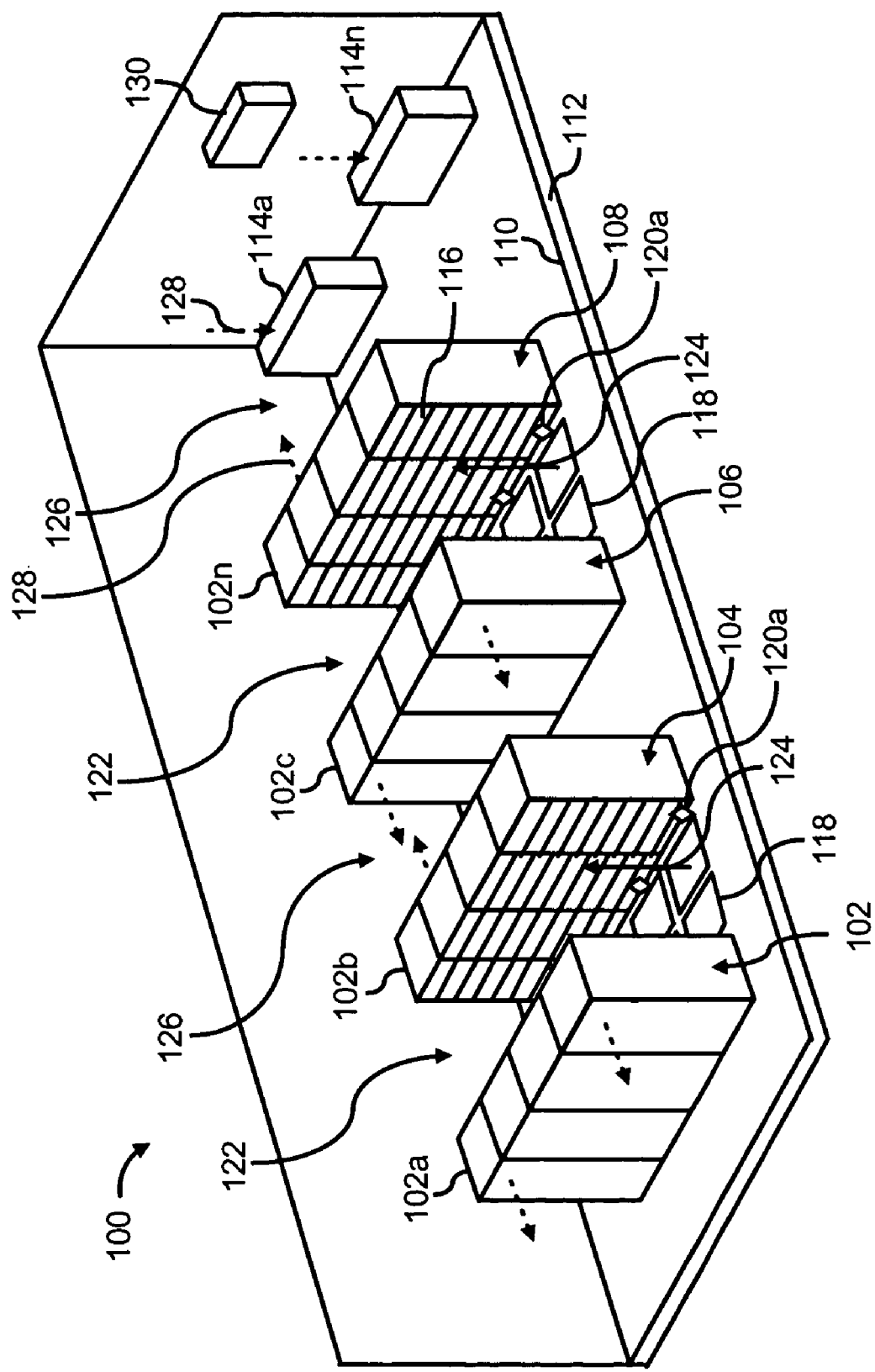
FIG. 1A shows a simplified perspective view of a data center, according to an embodiment of the invention.

For simplicity and illustrative purposes, the present invention is described by referring mainly to an embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Systems and methods for thermal management of heat generating devices by controlling cooling provisioning for the heat generating devices are disclosed herein. More particularly, the heat generating devices may be thermally managed through setting of the volume flow rates of air supplied by primary actuators (CRAC units) to required levels for the heat generating devices. In addition, the temperatures at which the airflow is supplied by the primary actuators may be varied to substantially maintain the heat generating devices within predetermined temperature ranges. As such, the volume flow rates at which airflow is supplied by the primary actuators may substantially be matched and set according to the flow rate requirements of the heat generating devices, while the temperatures of the airflow supplied may be varied as conditions, such as, workloads, vary in the heat generating devices.

In one regard, the volume flow rates at which the primary actuators are operated may be held at substantially constant levels and variations in cooling provisioning for the heat generating devices may be implemented by changing supply air temperatures. Therefore, for example, since the flow rates of supplied air are kept relatively constant and the temperatures are varied, control algorithms for the primary actuators may be relatively simplified. In addition, the primary actuators may be operated in relatively consistent and predictable manners.

A commissioning process is also disclosed herein to correlate the sensors and heat generating devices to the primary actuators. An example of a suitable commissioning process is disclosed in co-pending and commonly assigned U.S. patent application Ser. No. 11/078,087, filed on Mar. 11, 2005, and entitled "Commissioning of Sensors", the disclosure of which is hereby incorporated by reference in its entirety. As disclosed in that application, sensors may be grouped into primary actuator (CRAC unit) families according to the levels of influence each actuator has on each sensor as determined during a commissioning process.

In one example, the primary actuators comprise computer room air conditioning (CRAC) units capable of varying one or both of volume flow rate and temperature of airflow supplied to sensors and heat generating devices, such as racks or other heat dissipating equipment, in a data center. In this example, the determination of which CRAC units to manipulate, for instance, to maintain a particular sensor or heat generating device below a predetermined maximum temperature, is based upon the correlations determined between the CRAC units and the sensors/heat generating devices.

The systems and methods for thermal management disclosed herein may also be employed in any reasonably suitable environment containing actuators and sensors, such as, a building containing air conditioning units and sensors. In this regard, although particular reference is made throughout the present disclosure to data centers having CRAC units and heat generating devices, such as, racks, it should be understood that the systems and methods disclosed herein may be implemented in other environments having various air conditioners and heat generating devices. In addition, therefore, the particular references to data centers having CRAC units and racks are for illustrative purposes and are not intended to limit the systems and methods disclosed herein solely to data centers having CRAC units and racks.

With reference first to FIG. 1A, there is shown a simplified perspective view of a section of a data center 100 which may employ various examples of the cooling provisioning system disclosed herein. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

The data center 100 is depicted as having a plurality of racks 102a-102n, where "n" is an integer greater than one. The racks 102a-102n may comprise electronics cabinets, aligned in parallel rows and positioned on a raised floor 110. A plurality of wires and communication lines (not shown) may be located in a space 112 beneath the raised floor 110. The space 112 may also function as a plenum for delivery of cooled air from one or more actuators.

Also shown in FIG. 1A are computer room air conditioning (CRAC) units 114a-114n, where "n" is an integer greater than or equal to one, which are considered herein as primary actuators 114a-114n. The CRAC units 114a-114n are considered primary actuators 114a-114n because they are configured to manipulate characteristics of the cooled airflow supplied to the racks 102a-102n through actuation of one or more secondary actuators. As described below, the secondary actuators include a device for controlling supply air temperature and a device for controlling the supply flow rates of the cooled air.

Cooled air may be delivered from the space 112 to the racks 102a-102n through vent tiles 118 located between some or all of the racks 102a-102n. The cooled air contained in the space 112 may include cooled air supplied by one or more primary actuators 114a-114n. Thus, characteristics of the cooled air, such as, temperature, pressure, humidity, flow rate, etc., may substantially be affected by the operations of one or more of the primary actuators 114a-114n. In this regard, characteristics of the cooled air at various areas in the space 112 and the cooled air supplied to the racks 102a-102n may vary, for instance, due to mixing of the cooled air. In other words, the characteristics of the cooled air supplied to a particular location in the data center 100 may differ from that of the cooled air supplied by a single primary actuator 1114a.

At least one condition, for instance, temperature, pressure, or humidity, of the cooled air supplied to various areas of the data center 100 may be detected by sensors 120a-120n, where "n" is an integer greater than one. As shown, the sensors 120a-120n are represented as diamonds to distinguish them from other elements depicted in FIG. 1A. In addition, the sensors 120a-120n are depicted as being positioned to detect at least one condition at the inlets of the racks 102a-102n. In this example, the sensors 120a-120n may comprise temperature sensors or absolute humidity sensors. In another example, the sensors 120a-120n may be positioned within the space 112 near respective vent tiles 118 to detect the temperature, pressure, or humidity of the cooled air supplied through the respective vent tiles 118. Thus, although the sensors 120a-120n are depicted as being located on the raised floor 110, the sensors 120a-102n may be positioned at various other reasonably suitable locations, including, for example, near or within some or all of the components 116, near or within some or all of the primary actuators 114a-114n, etc.

In any regard, the sensors 120a-120n may be employed to detect at least one condition at various primary actuator 114a-ll4n settings. In addition, the sensors 120a-120n may be assigned to the families of one or more primary actuators 114a-114n. A primary actuator 114a-114n "family" may he defined as a grouping of sensors 120a-120n (or racks 102a-102n) that respond to the various primary actuator 114a-114n settings to levels greater than a predefined threshold level. In other words, the sensor 120a (or rack 102a) may be considered as being in the primary actuator 114a family if the response of the sensor 120a (or rack l02a) exceeds a predefined threshold level at various primary actuator 114a-114n settings. Various manners in which the sensors 120a-120n may be assigned to the one or more primary actuator 114a-114n families is described in the co-pending and commonly assigned U.S. patent application Ser. No. 11/078,087. In addition, various manners in which the racks 102a-102n may be assigned to the primary actuator 114a-114n families is described in greater detail herein below.

The racks 102a-102n are generally configured to house a plurality of components 116 capable of generating/dissipating heat, for instance, processors, micro-controllers, high-speed video cards, memories, semi-conductor devices, and the like. The components 116 may be elements of a plurality of subsystems (not shown), for instance, computers, servers, bladed servers, etc. The subsystems and the components may be operated to perform various electronic functions, for instance, computing, switching, routing, displaying, and the like.

The areas between the rows 102 and 104 and between the rows 106 and 108 may comprise cool aisles 122. These aisles are considered "cool aisles" because they are configured to receive cooled airflow from the vent tiles 118, as generally indicated by the arrows 124. In addition, and as shown, the racks 102a-102n generally receive cooled air from the cool aisles 122. The aisles between the rows 104 and 106, and on the rear sides of rows 102 and 108, are considered hot aisles 126. These aisles are considered "hot aisles" because they are positioned to receive air that has been heated by the components 116 in the racks 102a-102n, as indicated by the arrows 128.

Although not shown, the racks 102a-102n may be positioned to each face the same direction, such that there are no distinct "hot aisles" and "cool aisles". Additionally, the racks 102a-102n may be positioned with their rear sides adjacent to one another. In this example, the vent tiles 118 may be provided in each aisle 122 and 126. In addition, the racks 102a-102n may comprise outlets on top panels thereof to enable heated air to flow out of the racks 102a-102n.

As described herein above, the primary actuators 114a-114n generally operate to cool received heated air as indicated by the arrows 128. In addition, the primary actuators 114a-114n may supply the racks 102a-102n with airflow that has been cooled, through any reasonably suitable known manners and may thus comprise widely available, conventional CRAC units. For instance, the primary actuators 114a-114n may comprise vapor-compression type air conditioning units, chilled water air conditioning units, etc. Examples of suitable primary actuators 114a-114n may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

Also shown in FIG. 1A is a controller 130 configured to perform various functions in the data center 100. The controller 130 may receive data from the primary actuators 114a-114n and the sensors 120a-120n and may perform various computations on the data. In one regard, the controller 130 may operate to assign the sensors 120a-120n into one or more primary actuator 114a-114n families. According to an example, the controller 130 may implement the commissioning procedures disclosed in the co-pending and commonly assigned U.S. patent application Ser. No. 11/078,087 to assign the sensors 120a-120n into the one or more primary actuator 114a-114n families. The controller 130 may also implement commissioning procedures to assign the racks 102a-102n into one or more primary actuator 114a-114n families.

The controller 130 may also operate the primary actuators 114a-114n based upon the correlations between the primary actuators 114a-114n and the sensors 120a-120n. In operating the primary actuators 114a-114n, the controller 130 may set the secondary actuators of the primary actuators 114a-114n to operate at various setpoints as described in greater detail herein below.

Although the controller 130 is illustrated in FIG. 1A as comprising a component separate from the components 116 housed in the racks 102-108, the controller 130 may comprise one or more of the components 116 without departing from a scope of the data center 100 disclosed herein. In addition, or alternatively, the controller 130 may comprise software configured to operate on a computing device, for instance, one of the components 116.

Figure 1B:
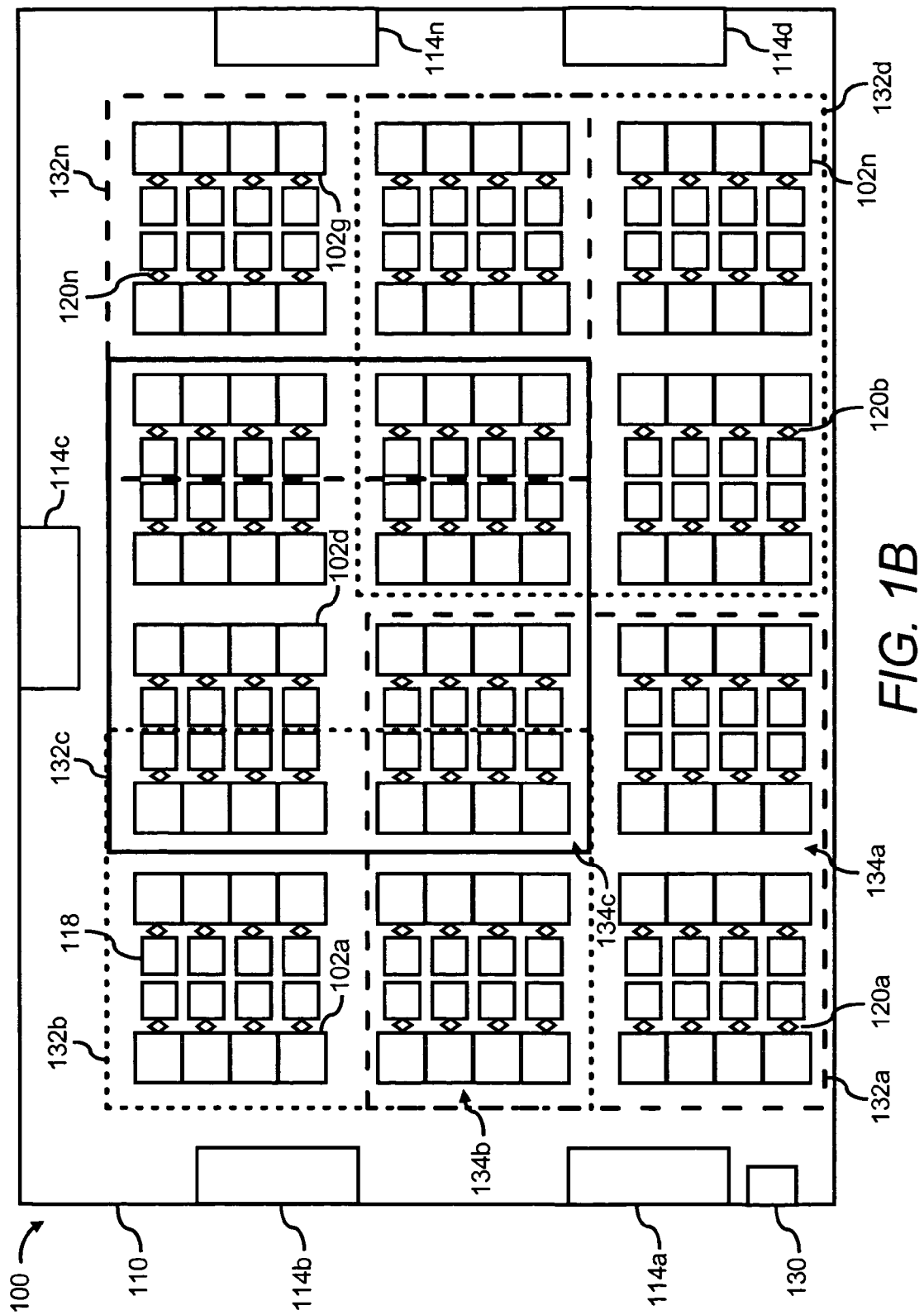
FIG. 1B is a simplified plan view of the data center depicted in FIG. 1A.

With reference now to FIG. 1B, there is shown a simplified plan view of the data center 100 depicted in FIG. 1A. The data center 100 is shown as including primary actuators 114a-114n positioned at various locations throughout the data center 100. A plurality of vent tiles 118 are also illustrated in FIG. 1B and are configured to deliver cooled airflow to racks 102a-102n as described above. It should be appreciated that the data center 100 may include any reasonably suitable number of racks 102a-102n and primary actuators 114a-114n without departing from the data center 100 illustrated in FIG. 1B.

As described herein above, the vent tiles 118 and the racks 102a-102n are positioned on a raised floor 110, beneath which lies a space 112 (FIG. 1A). The space 112 is in fluid communication with the primary actuators 114a-114n and generally operates, in one respect, as a plenum for supplying cooling airflow from the primary actuators 114a-114n to be delivered through the vent tiles 118. In most instances, the space 112 may comprise a relatively open space that is accessible by cooling airflow supplied by a plurality of the primary actuators 114a-114n. In this regard, the cooling airflow supplied by the primary actuators 114a-114n may mix in the space 112. Therefore, the cooling airflow supplied to the racks 102a-102n by the vent tiles 118 may have originated from more than one of the primary actuators 114a-114n.

Although particular reference is made throughout the present disclosure to a raised floor 110, it should be understood that various other types of cooling arrangements may be employed without departing from the systems and methods disclosed herein. For instance, the data center 100 may include a lowered ceiling which may also include a space that is operable as a plenum. In addition, or alternatively, the data center 100 may include ceiling mounted heat exchangers, such as those disclosed in commonly assigned U.S. Pat. No. 6,786,056, entitled "Cooling System With Evaporators Distributed In Parallel", the disclosure of which is hereby incorporated by reference in its entirety.

Also shown in FIG. 1B are the sensors 120a-120n, which are illustrated as being positioned with respect to each of the racks 102a-102n. As also suited above, the sensors 120a-120n may also, or in the alternative, be positioned to detect the at least one condition within the space 112. In addition, the sensors 120a-120n may comprise sensors contained in some or all of the components 116. As a further example, the sensors 120a-120n may be positioned near or within the primary actuators 114a-114n. In any regard, the sensors 120a-120n and the racks 102a-102n may be grouped in various primary actuator 114a-114n families based upon various criteria. The various primary actuator 114a-114n families 132a-132n corresponding to respective primary actuators 114a-114n are illustrated in FIG. 1B. As shown, the sensors 120a-120n and racks 102a-102n are considered as being within the families 132a-132n of those primary actuators 114a-114n.

Some of the sensors 120a-120n and racks 102a-102n, for instance, the sensors 120a-120n and racks 102a-102n in a first section 134a may be included in the family 132a of a single primary actuator 114a. Some of the other sensors 120a-120n (and racks 102a-102n), for instance, the sensors 120a-120n and racks 102a-102n in a second section 134b may be included in the families 132a and 132b of two primary actuators 114a and 114b. In addition, some of the sensors 120a-120n and racks 102a-102n, for instance, the sensors 120a-120n and racks 102a-102n in a third section 134c may be included in the families 132a-132c of three primary actuators 114a-114c. As such, for instance, one or more of the sensors 120a-120n and racks 102a-102n may belong to more than one primary actuator 114a-114n family.

It should, in any regard, be understood that the families 132a-132n depicted in FIG. 1B are for purposes of illustration and are not intended to limit the data center 100 and its components in any respect. It should also be understood that the depiction of the families 132a-132n in FIG. 1B are for illustrative purposes only and are not meant to limit the data center 100 in any respect.

Figure 2:
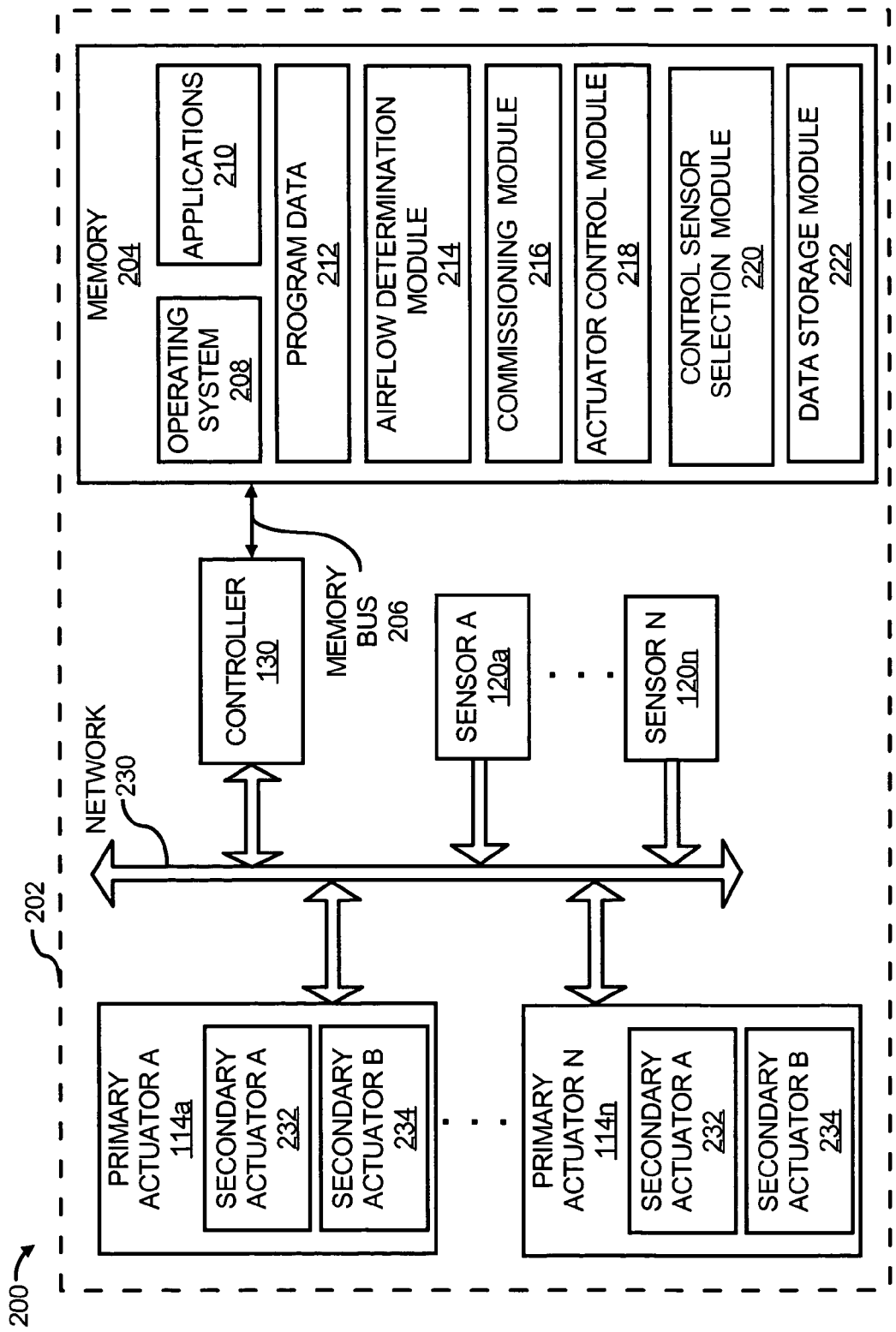
FIG. 2 is a block diagram of a cooling provisioning system according to an embodiment of the invention.

FIG. 2 is a block diagram 200 of a cooling provisioning system 202. It should be understood that the following description of the block diagram 200 is but one manner of a variety of different manners in which such a cooling provisioning system 202 may be configured. In addition, it should be understood that the cooling provisioning system 202 may include additional components and that some of the components described herein may be removed and/or modified without departing from the scope of the cooling provisioning system 202. For instance, the cooling provisioning system 202 may include any number of sensors, memories, processors, air conditioning (AC) units, etc., as well as other components, which may be implemented in the operations of the cooling provisioning system 202.

Generally speaking, the cooling provisioning system 202 is employed to control the primary actuators 114a-114n, which may comprise the CRAC units 114a-114n, or other AC units. In one regard, the cooling provisioning system 202 may be employed to control at least one environmental condition at the locations of various heat generating devices, such as the racks 102a-102n, or other heat dissipating devices known to be cooled through use of air conditioning systems. As described in greater detail herein below, determination of primary actuator 114a-114n families may be used to determine which of the primary actuators 114a-114n are to be manipulated in response to conditions at the heat generating devices. In addition, control over the primary actuators 114a-114n may be effectuated through manipulation of one or more secondary actuators 232 and 234. One of the secondary actuators 232 may comprise a variable frequency drive (VFD) or other suitable mechanism for controlling an airflow volume varying device, such as a blower or fan. The other secondary actuator 234 may comprise a device for controlling the temperature of the cooled air supplied by the primary actuators 114a-114n. Thus, the secondary actuator 234 may depend upon the type of primary actuator 114a-114n in which the secondary actuator 234 is located.

More particularly, for instance, if the primary actuator 114a-114n comprises a vapor-compression type AC unit, the secondary actuator 234 may comprise a variable speed compressor configured to vary the temperature of the airflow supplied by the AC unit. If the primary actuator 114a-114n comprises a chilled water AC unit, the secondary actuator may comprise a two or three-way valve configured to control the temperature of a coolant configured to receive heat from the airflow.

The secondary actuators 234 may also comprise devices for varying other characteristics of the airflow supplied by the primary actuators 114a-114n. The secondary actuators 234 may comprise, for instance, humidifiers/dehumidifiers configured to vary the absolute humidity of the airflow supplied by the primary actuators 114a-114n. In this example, the sensors 120a-120n may comprise absolute humidity sensors. In addition, therefore, the primary actuators 114a-114n in this example may operate to maintain the absolute humidity levels at the heat generating device locations within predefined thresholds.

In any respect, the controller 130 is configured to control the primary actuators 114a-114n and thus the secondary actuators 232 and 234. The controller 130 may comprise a computing device, for instance, a computer system, a server, a proportional, integral, derivative (PID) control system, etc. In addition, the controller 130 may comprise a microprocessor, a micro-controller, an application specific integrated circuit (ASIC), and the like, configured to perform various processing functions. In addition, or alternatively, the controller 130 may comprise software operating in any of a number of computing devices.

The controller 130 is illustrated as being in communication with a memory 204 through, for instance, a memory bus 206. However, in certain instances, the memory 204 may form part of the controller 130 without departing from a scope of the cooling provisioning system 202. Generally speaking, the memory 204 may be configured to provide storage of software, algorithms, and the like, that provide the functionality of the controller 130. By way of example, the memory 204 may store an operating system 208, application programs 210, program data 212, and the like. In this regard, the memory 204 may be implemented as a combination of volatile and non-volatile memory, such as DRAM, EEPROM, MRAM, flash memory, and the like. In addition, or alternatively, the memory 204 may comprise a device configured to read from and write to a removable media, such as, a floppy disk, a CD-ROM, a DVD-ROM, or other optical or magnetic media.

The memory 204 also stores an airflow determination module 214, a commissioning module 216, an actuator control module 218, a control sensor selection module 220, and a data storage module 222. The controller 130 may implement the modules 214-222 in controlling the environmental conditions at the sensor 120a-120n locations.

More particularly, according to a first example, the controller 130 may implement the airflow determination module 214 to determine the volume of airflow recommended for the heat generating devices. The recommended airflow volume of each of the heat generating devices may be based upon the total airflow volumes recommended for the heat generating devices or the components 116 housed in the heat generating devices. In this regard, the recommended airflow volumes for the heat generating devices may comprise airflow volumes that are recommended by the manufacturers of the heat generating devices or the recommended airflow volumes for the heat generating devices may be determined through various testing schemes. In addition, the recommended airflow volumes for the heat generating devices may be stored, for instance, in the form of a look-up table in the data storage module 222.

In a second example, for instance, in situations where the recommended volume flow rates are not known or obtainable in a relatively simple manner, the controller 130 may implement the airflow determination module 214 to iteratively set the volume flow rates of the primary actuators 114a-114n. More particularly, for instance, the airflow determination module 214 may be implemented to determine the extents of over-provisioning by the primary actuators 114a-114n and to iteratively reduce the volume flow rates at which airflow is supplied by the primary actuators 114a-114n until the primary actuators 114a-114n operate at levels below a predefined threshold.

The controller 130 may implement the commissioning module 216 to commission the sensors 120a-120n. More particularly, the controller 130 may implement the commissioning module 216 to assign each of the sensors 120a-120n to one or more primary actuator 114a-114n families. The commissioning of the sensors 120a-120n may be performed as disclosed in the co-pending and commonly assigned U.S. patent application Ser. No. 11/078,087.

The controller 130 may also implement the commissioning module 216 to commission the heat generating devices through correlations between the heat generating devices and the sensors 120a-120n. The correlations between the heat generating devices and the sensors 120a-120n may be based upon the relative locations of the heat generating devices with respect to the sensors 120a-120n, which may be determined through direct correlations, extrapolations, modeling, etc. In addition, the assignments of the heat generating devices to the primary actuators 114a-114n may be stored in the data storage module 222. More particularly, for instance, the primary actuator 114a-114n families may be stored in the form of a look-up table in the data storage module 222.

In the first example described above, the controller 130 may implement the actuator control module 218 to set the volume rates of airflow supplied by each of the primary actuators 114a-114n according to the recommended airflow volumes for the heat generating devices in their respective families. In the second example described above, the controller 130 may implement the actuator control module 218 to set the volume rates of airflow supplied by each of the primary actuators 114a-114n to the rates determined through the iterative reduction process described in greater detail herein below with respect to FIG. 4B.

The controller 130 may implement the control sensor selection module 220 to select a control sensor 120n for each of the primary actuator 114a-114n families. The control sensor 120n may be defined as the sensor 120a with the largest positive temperature difference from a setpoint temperature in each primary actuator 114a-114n family. In addition, or alternatively, the control sensor 120n may be defined as the sensor 120a having either the largest negative difference or the smallest negative difference from the setpoint temperature if all of the sensors 120a-120n have negative temperature differences from the setpoint temperature. In any event, the setpoint temperatures used to determine the control sensor 120n may vary between the sensors 120a-120n and is thus not required to be identical for all of the sensors 120a-120n.

The controller 130 may implement the data storage module 222 to store various data in a data storage location in the memory 204. The data storage module 222 may be implemented to store the correlations between the sensors 120a-120n and the primary actuators 114a-114n. The data storage module 222 may store this correlation information in a variety of different manners. For instance, the data storage module 222 may store the information in the form of a look-up table. In addition, or alternatively, the data storage module 222 may store the information in the form of a map that may be employed to visualize the positions of the sensors 120a-120n and the primary actuator families 132a-132n to which they are related.

Instructions from the controller 130 may be transmitted over a network 230 that operates to couple the various components of the cooling provisioning system 202. Although not shown, the controller 130 may be equipped with or have access to software and/or hardware to enable the controller 130 to transmit and receive data over the network 230. The network 230 generally represents a wired or wireless structure in the data center 100 for the transmission of data between the various components of the cooling provisioning system 202. The network 230 may comprise an existing network infrastructure or it may comprise a separate network configuration installed for the purpose of cooling provisioning by the controller 130.

The sensors 120a-120n may be configured to transmit collected data over the network 230 for storage and processing. Although not shown, the sensors 120a-120n may comprise one or more clusters of sensors 120a-120n connected to the network 230 through one or more base stations or gateways. An example of a suitable base station or gateway as well as communication schemes between the sensors 120a-120n over a network is disclosed in co-pending and commonly assigned U.S. patent application Ser. No. 11/002,675, filed on Dec. 3, 2004, and entitled "Sensed Data Communication Over A Network", the disclosure of which is hereby incorporated by reference in its entirety.

In any regard, the sensors 120a-120n may comprise sensors configured to detect at least one environmental condition at various locations in the data center 100. The at least one environmental condition may comprise temperature, absolute humidity, or pressure and the sensors 120a-120n may be configured to detect at least one of these conditions. The sensors 120a-120n may also be configured to compare detected environmental conditions with predefined environmental conditions to determine differences between the detected environmental conditions and the predefined environmental conditions. The sensors 120a-120n may transmit these differences as signals to the controller 130, where the strengths of the signals correspond to the difference levels. In addition, the controller 130 may vary operations of the actuator control module 218 according to the types of environmental condition detected and the magnitudes of the signals received from the sensors 120a-120n.

The primary actuators 114a-114n may also include respective interfaces (not shown) that generally enable data transfer between the primary actuators 114a-114n and the controller 130 over the network 230. The interfaces may comprise any reasonably suitable hardware and/or software capable to enabling the data transfer over the network 230. In addition, the primary actuators 114a-114n may also include controllers (not shown) configured to control the secondary actuators 222 and 224 based upon instructions or signals received from the controller 130. In one example, the controller 130 and the controllers of the primary actuators 114a-114n may both comprise proportional, integral, derivative (PID) controllers, for instance, in a cascading PID control arrangement. In this example, the controller 130 may receive signals from the sensors 120a-120n having magnitudes corresponding to the differences between detected and predefined conditions. The controller 130 may transmit signals to the controllers of the primary actuators 114a-114n according to the magnitudes of the signals received from the sensors 120a-120n. In addition, the controllers of the primary actuators 114a-114n may operate the secondary actuators 222 and 224 according to the magnitudes of the signals received from the controller 130.

Figure 3:
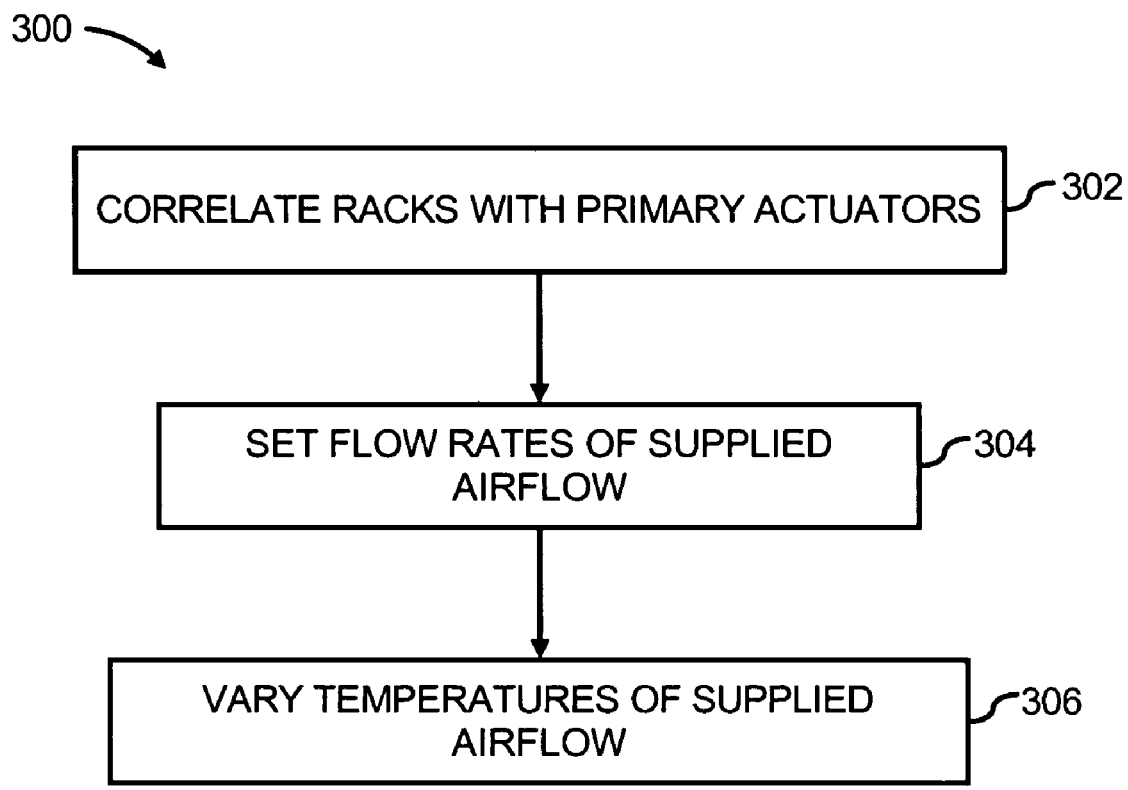
FIG. 3 illustrates a flow diagram of a method for controlling cooling provisioning for heat generating devices, according to an embodiment of the invention.

FIG. 3 illustrates a flow diagram of a method 300 for controlling cooling provisioning for heat generating devices, according to an example. It is to be understood that the following description of the method 300 is but one manner of a variety of different manners in which an example of the invention may be practiced. It should also be apparent to those of ordinary skill in the art that the method 300 represents a generalized illustration and that other steps may be added or existing steps may be removed, modified or rearranged without departing from a scope of the method 300.

The description of the method 300 is made with reference to the block diagram 200 illustrated in FIG. 2, and thus makes reference to the elements cited therein. It should, however, be understood that the method 300 is not limited to the elements set forth in the block diagram 300. Instead, it should be understood that the method 300 may be practiced by a cooling provisioning system having a different configuration than that set forth in the block diagram 200.

In the method 300, the controller 130 may correlate the heat generating devices with the primary actuators 114a-114n, such that the heat generating devices are associated with primary actuators 114a-114n having at least a predefined level of influence over the respective heat generating devices at step 302. The controller 130 may also set the flow rates of air supplied by the primary actuators 114a-114n based upon volume flow rate requirements for the heat generating devices at step 304. More particularly, the controller 130 may set the volume flow rate of air supplied by each primary actuator 114a-114n according to the volume flow rate requirements of the heat generating devices associated with each of the primary actuators 114a-114n. In addition, at step 306, the controller 130 may vary temperatures of the airflow supplied by the primary actuators 114a-114n to substantially maintain associated heat generating devices within predetermined temperature ranges. A more detailed description of the steps outlined in the method 300 is provided below with respect to the methods 400 and 450.

Figure 4A:
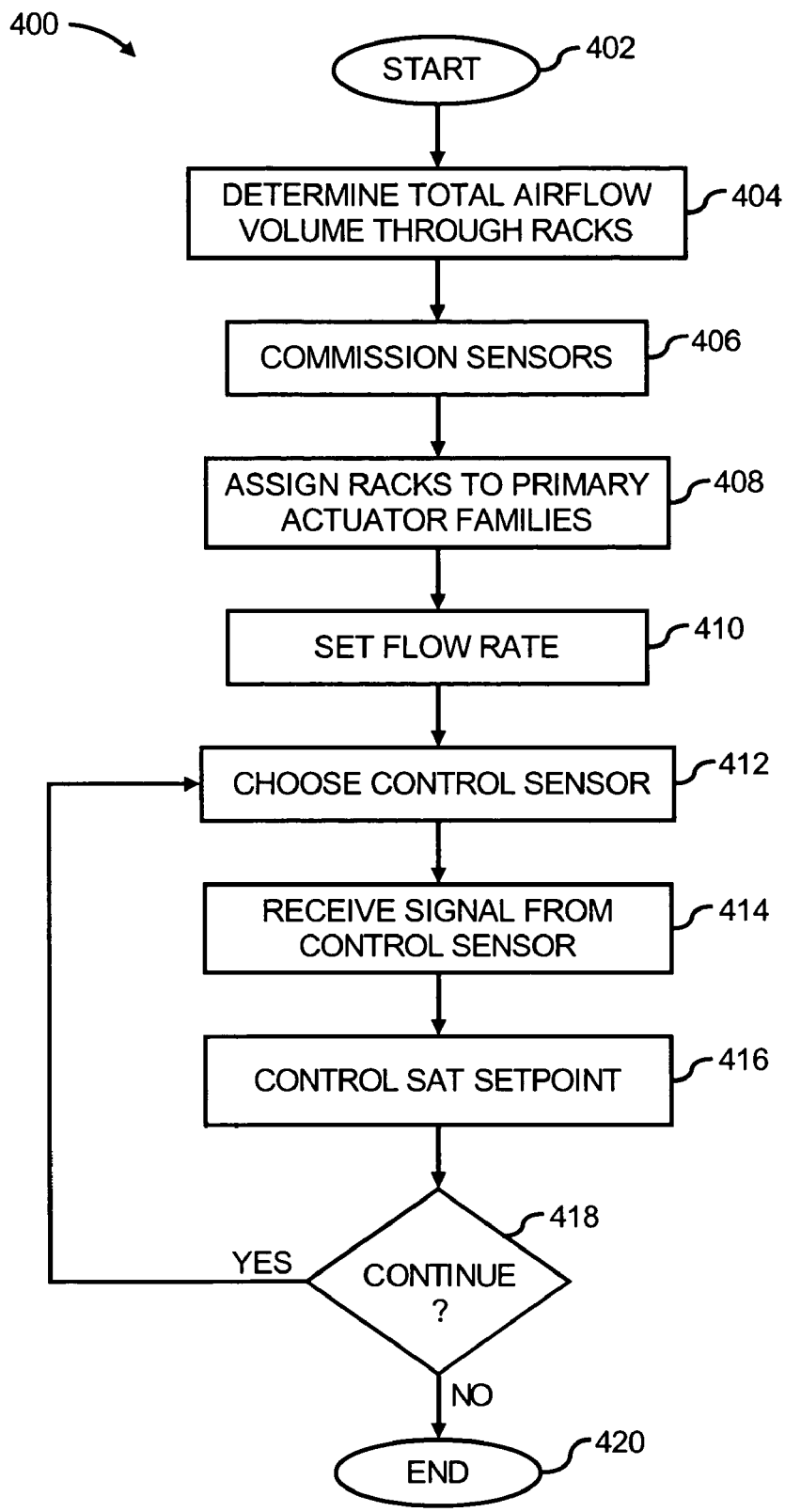
FIG. 4A illustrates a flow diagram of a method, which includes steps additional to the method depicted in FIG. 3, according to an embodiment of the invention.

With particular reference now to FIG. 4A, there is shown a flow diagram of a method 400 for controlling cooling provisioning for the heat generating devices, according to an example. It is to be understood that the following description of the method 400 is but one manner of a variety of different manners in which an example of the invention may be practiced. It should also be apparent to those of ordinary skill in the art that the method 400 represents a generalized illustration and that other steps may be added or existing steps may be removed, modified or rearranged without departing from a scope of the method 400.

The description of the method 400 is made with reference to the block diagram 200 illustrated in FIG. 2, and thus makes reference to the elements cited therein. It should, however, be understood that the method 400 is not limited to the elements set forth in the block diagram 200. Instead, it should be understood that the method 400 may be practiced by a cooling provisioning system having a different configuration than that set forth in the block diagram 200.

The method 400 may be implemented to control primary actuators (CRAC units) 114a-114n to thereby control environmental conditions at various heat generating devices, such as the racks 102a-102n, or other heat dissipating equipment. For instance, the primary actuators 114a-114n may be controlled as disclosed below to set the volume flow rates of airflow delivered to the heat generating devices to levels that correspond to the recommended volume flow rates for the heat generating devices. In many instances, the volume flow rates may be set with a predefined level of over-provisioning to provide a margin of safety in supplying cooling airflow to the heat generating devices. The volume flow rates supplied to the heat generating devices may be maintained at the set levels during operations of the heat generating devices. In addition, the primary actuators 114a-114n may be controlled to vary the temperatures of the cooling airflow supplied to the heat generating devices to substantially maintain the heat generating devices below predefined temperatures. In this regard, the volume flow rates may substantially be set according to the recommended levels and the temperature of the cooling airflow may be varied in response to varying conditions in an environment containing heat generating devices, such as the data center 100.

The method 400 may be initiated at step 402 in response to any of a number of stimuli or conditions. For instance, the method 400 may be initiated with activation of components, such as, the CRAC units 114a-114n. In addition, or alternatively, the method 400 may be manually initiated or the controller 130 may be programmed to initiate the method 400 at various times, for a set duration of time, substantially continuously, etc.

Once initiated, at step 404, the controller 130 may optionally implement the airflow determination module 214 to determine the volume of airflow recommended for the heat generating devices. The recommended airflow volume of each of the heat generating devices may be based upon the total airflow volumes recommended for components housed in the heat generating devices. Thus, for instance, if a heat generating device comprises a rack 102a having ten (10) components 116, each requiring 100 CFM of cooling airflow, the total recommended airflow volume for that rack 102a is 1000 CFM. In addition, the recommended airflow volumes for the heat generating devices may vary from one heat generating device to another heat generating device.

The recommended airflow volumes for the heat generating devices may comprise airflow volumes that are recommended by the manufacturers of the heat generating devices. Alternatively, the recommended airflow volumes for the heat generating devices may be determined through various testing schemes. For instance, the recommended airflow volumes for the heat generating devices may be tested at various temperatures to determine the airflow volume levels at which the heat generating devices receive sufficient cooling. In addition, the volume levels at which air flows through the heat generating devices may be determined through a variety of means, for instance, temperature difference, power, flow sensors, etc. In any regard, the recommended airflow volumes for the heat generating devices may be stored, for instance, in the form of a look-up table in the data storage module 222.

The implementation of the airflow determination module 214 at step 404 is considered as being optional because the primary actuators 114a-114n may be set to operate at 100% blower speed, such as, in cases where the primary actuators 114a-114n do not have VFD's. The following steps may also be performed at the 100% blower speed.

At step 406, the controller 130 may implement the commissioning module 216 to commission the sensors 120a-120n. More particularly, the sensors 120a-120n may be assigned to primary actuator 114a-114n families according to, for instance, the level of influence the primary actuators 114a-114n have over the sensors 120a-120n. In addition, a sensor 120a may be considered its being in the family of a primary actuator 114a if the level of influence of that actuator 114a over the sensor 120a exceeds a predefined threshold. In addition. if a sensor 120a is assigned to multiple primary actuator 114a-114n families, a filtering process may be implemented to assign the sensor 120a to the primary actuator 114a that has the greatest level of influence over the sensor 120a. The filtering process may also be implemented to keep the sensor in multiple primary actuator 114a-114n families if the influence levels of the primary actuators 114a-114n are within predefined thresholds. Examples of a suitable commissioning process and a suitable filtering process is disclosed in the co-pending and commonly assigned U.S. patent application Ser. No. 11/078,087, the disclosure of which is hereby incorporated by reference in its entirety.

The controller 130 may also implement the commissioning module 216 to assign the heat generating devices to the primary actuator 114a-114n families at step 408. The heat generating devices may be assigned to the primary actuator 114a-114n families through correlations between the heat generating devices and the sensors 120a-120n. For instance, in an environment where there is at least a one-to-one correlation between the heat generating devices and the sensors 120a-120n, the heat generating devices may be assigned to the primary actuator 114a-114n families to which their associated sensor(s) 120a-120n belongs.

However, in an environment where there is less than a one-to-one correlation between the heat generating devices and the sensors 120a-120n, the heat generating devices may be assigned to the primary actuator 114a-114n families through techniques such as extrapolation, modeling, etc. For instance, if extrapolation techniques are implemented to commission the heat generating devices, those heat generating devices that have associated commissioned sensors 120a-120n may be used as bases for commissioning the remaining heat generating devices. By way of example, the remaining heat generating devices may be commissioned according to their proximities to the heat generating devices having associated commissioned sensors 120a-120n. If modeling techniques are employed, flow characteristics in the environment, such as the data center 100, may be estimated or modeled at various primary actuator 114a-114n settings to estimate the levels of influence each of the primary actuators 114a-114n have in various areas of the environment. Based upon this estimation and knowledge of the heat generating device locations, the heat generating devices may be correlated to the primary actuators 114a-114n that influence the heat generating devices beyond a predefined threshold. In this regard, for instance, the heat generating devices may be commissioned with respect to the primary actuators 114a-114n even in environments where the sensors 120a-120n are only located near, on, or within, the primary actuators 114a-114n.

In any regard, the correlations between the heat generating devices and the primary actuators 114a-114n may be stored in the data storage module 222. More particularly, for instance, the primary actuator 114a-114n families may be stored in the form of a look-up table in the data storage module 222.

At step 410, in a first example, the controller 130 may implement the actuator control module 218 to set the volume rates of airflow supplied by each of the primary actuators 114a-114n according to the recommended airflow volumes for the heat generating devices in their respective families. Thus, for instance, if a first and a second heat generating device is in the family of the primary actuator 114a, and the first and second heat generating devices each have recommended volume flow rates of 1000 CFM, the primary actuator 114a may be set to supply cooling airflow at 2000 CFM. More particularly, for instance, the controller 130 may transmit a control signal to the primary actuator 114a to set the secondary actuator 232 to operate at the setpoint associated with the volume flow rate set at step 410. As described above with respect to the control system 202, the secondary actuators 232 may comprise variable frequency drives (VFD) for controlling an airflow volume varying device, such as a blower or fan. In addition, at step 410, the controller 130 may instruct the primary actuators 114a-114n to operate at volume flow rate setpoints that exceed the recommended the volume flow rates by a predefined level to, for instance, to provide a margin of safety in supplying cooling airflow to the heat generating devices.

According to a second example, step 410 may be omitted, as when the speeds of the blowers are set to 100% as described above with respect to step 404. More particularly, step 410 may be omitted in this example because the flow rates have already been set to 100% at step 404.

At step 412, for each primary actuator 114a-114n family, the controller 130 may implement the control sensor selection module 220 to choose the control sensor 120n. As described above, the control sensor 120n may be defined as the sensor 120a with the largest positive temperature difference from a setpoint temperature in each primary actuator 114a-114n family. In addition, or alternatively, the control sensor 120n may be defined as the sensor 120a having the largest negative difference or the smallest negative difference from the setpoint temperature if all of the sensors 120a-120n have negative temperature differences from the setpoint temperature. In either event, the setpoint temperatures used to determine the control sensor 120n may also vary between the sensors 120a-120n and is thus not required to be identical for all of the sensors 120a-120n.

In general, the temperatures of the control sensors 120a-120n are used to control the primary actuators 114a-114n of the families to which the control sensors 1201a-120n belong. More particularly, the following steps may be performed to vary the setpoints of the secondary actuators 234 configured to vary the temperatures of the airflow supplied by the primary actuators 114a-114n. In one respect, the setpoints of the secondary actuators 234 may be adjusted to substantially ensure that maximum temperatures for the heat generating devices are maintained.

At step 414, the controller 130 may receive signals from the control sensors 120a-120n of the primary actuator 114a-114n families. The signals are generally control signals for operating respective primary actuators 114a-114n. The signals are generated according to the levels of error between measured temperatures and predefined temperatures. More particularly, if the temperature difference is relatively small, the signal sent to the controller 130 is also relatively small. Alternatively, if the temperature difference is relatively large, the signal sent to the controller 130 is also relatively large. The controller 130, in this case, may comprise a proportional, integral, derivative (PID) controller, and may control operations of the primary actuators 114a-114n based upon the magnitudes of the control signals received from the control sensors 120a-120n as described in greater detail herein below with respect to step 418. In addition, each of the primary actuators 114a-114n may include respective PID controllers.

For each primary actuator 114a-114n family having a control sensor 120a-120n that transmits a control signal indicating an error, the controller 130 may implement the actuator control module 218 to control the supply air temperature (SAT) of the associated primary actuators 114a-114n at step 416. More particularly, for instance, the controller 130 may transmit control signals to the primary actuators 114a-114n to respectively set their secondary actuators 234 to the setpoints corresponding to the level of error between the detected temperature and the predefined temperature of their respective control sensor 120a-120n. As also described above with respect to the control system 202, the secondary actuators 234 may comprise devices for controlling the temperatures of the cooled air supplied by the primary actuators 114a-114n, and may depend upon the type of primary actuator 114a-114n in which the secondary actuator 234 is located.

By way of example, if the sensor 120a is the control sensor for the primary actuator 114a, and the sensor 120a transmits a signal to the controller 130 corresponding to a temperature difference of +5 degrees Celsius, the controller 130 may transmit a control signal to the primary actuator 114a to vary its SAT setpoint according to the +5 degree Celsius difference. The magnitude of the control signal sent from the controller 130 to the primary actuator 114a in this instance may correspond to this temperature difference. In response, the primary actuator 114a, or a controller thereof, may adjust the SAT setpoint of the secondary actuator 234 to correct for the temperature difference.

At step 418, it may be determined as to whether the method 400 is to continue. If a "no" condition is reached at step 414, the method 400 may end as indicated at step 420. The method 400 may end, for instance, following a predetermined length of time, following a predetermined number of iterations, manually discontinued, etc. If a "yes" condition is reached at step 418, the method 400 may continue beginning at step 412. More particularly, the control sensors 120a-120n for each primary actuator 114a-114n family may be chosen again. The control sensors 120a-120n may be selected again because they may have changed due to manipulations of the secondary actuators 234 at step 412. In addition, steps 414-418 may be repeated for a substantially indefinite period of time or when it is determined that the operational mode 400 is to be discontinued at step 418.

Although not shown, steps 404-410 may be repeated, for instance, if new equipment is installed in the data center 100, if vent tiles 118 have been moved, if equipment has been moved or re-oriented, if racks 102a-102n have been removed or replaced, etc.

According to another example, some or all of the steps contained in the method 400 may be performed on a zonal basis. In this example, step 408 may additionally include the step of assigning the primary actuators 114a-114n into one or more zones. The zones may include two or more primary actuators 114a-114n, including all of the primary actuators 114a-114n in the data center 100. In addition, zones may comprise, for instance, primary actuators 114a-114n that are in relatively close proximity to each other. The zones may also comprise the heat generating devices belonging to the primary actuators 114a-114n contained in the respective zones. The primary actuators 114a-114n may be assigned to the zones based upon, for instance, the degree of primary actuator 114a-114n family overlap during the commissioning process, the proximities of the primary actuators 114a-114n in a data center 100, the installation of plenum dividers that effectively limit the influence of various primary actuators 114a-114n, etc.

In this example, at step 410, the flow rates of the primary actuators 114a-114n in each zone may be set according to the recommended flow rates for all of the heat generating devices contained in each zone. In other words, the zonal primary actuator 114a-114n flow rates may be based upon the zonal heat generating device flow requirements. In addition, at step 412, instead of choosing a sensor 120a-120n in each primary actuator 114a-114n family, the controller 130 is configured to implement the control sensor selection module 220 to choose a control sensor 120a for each zone, according to, for instance, the criteria defined above for choosing a control sensor 120a. The control sensors 120a-120n for each zone are used to control the primary actuators 114a-114n contained in the respective zones as described in greater detail herein below.

At step 414, the controller 130 may receive control signals from the control sensors 120a-120n for each zone according to the levels of error between the measured temperatures and the predefined temperatures. At step 416, for each zone having a control sensor 120a-120n that transmits a control signal indicating an error, the controller 130 may implement the actuator control module 218 to manipulate the secondary actuators 234 of the primary actuators 114a-114n contained in that zone in manners similar to those described in greater detail hereinabove.

In addition, steps 418 and 420 may be performed in much the same way as described above and is thus not described in great detail here.

Figure 4B:
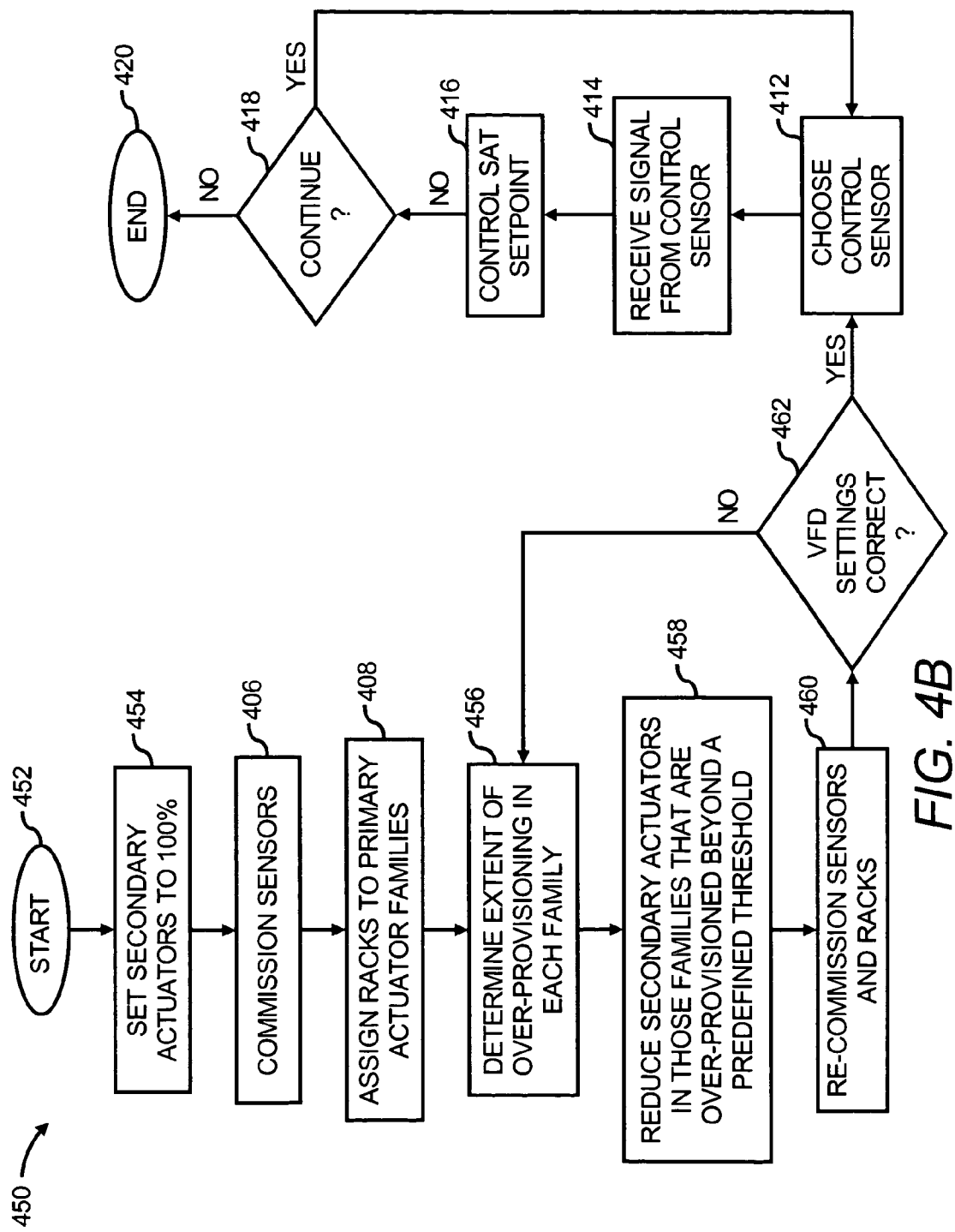
FIG. 4B illustrates a flow diagram of a method, which includes steps additional to the method depicted in FIG. 3, according to another embodiment of the invention.

With reference now to FIG. 4B, there is shown a flow diagram of a method 450 for controlling cooling provisioning for the heat generating devices, according to another example. Some of the steps contained in the method 450 are similar to those discussed above with respect to the method 400. These similar steps will not be described in great detail herein, but instead, the descriptions of these steps presented hereinabove are relied upon to provide an adequate understanding of the method 450.

In one respect, the method 450 differs from the method 400 in that the recommended volume flow rates for the heat generating devices need not be determined prior to performance of the method 450. In this regard, the method 450 may be implemented to control cooling provisioning for the heat generating devices in situations where the recommended volume flow rates are not known or obtainable in a relatively simple manner.

The description of the method 450 is also made with reference to the block diagram 200 illustrated in FIG. 2, and thus makes reference to the elements cited therein. It should, however, be understood that the method 450 is not limited to the elements set forth in the block diagram 200. Instead, it should be understood that the method 450 may be practiced by a cooling provisioning system having a different configuration than that set forth in the block diagram 200.

The method 450 may be initiated at step 452 in response to any of a number of stimuli or conditions. For instance, the method 450 may be initiated with activation of components, such as, the primary actuators 114a-114n. In addition, or alternatively, the method 450 may be manually initiated or the controller 130 may be programmed to initiate the method 450 at various times, for a set duration of time, substantially continuously, etc.

Once initiated, at step 454, the controller 130 may transmit instructions to the primary actuators 114a-114n to set the secondary actuators 232 to operate at 100% of their rated capacities. The sensors 120a-120n may be commissioned at step 406 as described above, but with the secondary actuators 232 of the primary actuators 114a-114n set to the 100% rated capacities. In addition, as indicated at step 408, the heat generating devices may be assigned to the primary actuator 114a-114n families.

At step 456, the controller 130 may determine the extent to which each of the primary actuator 114a-114n families are over-provisioned. The determination as to whether a primary actuator 114a family is over-provisioned may be based upon, for instance, provisioning in each of the primary actuators 114a-114n. The provisioning may be checked by: 1) checking provisioning of the primary actuators 114a-114n; and 2) if through item 1), it is determined that the primary actuators 114a-114n are within a predefined threshold, for instance, 80% or below, checking whether the secondary actuator 234 (SAT actuators) are operating above a predefined threshold, for instance, 80% or below. In this regard, those primary actuators 114a-114n determined to be operating at levels above the predefined thresholds, may be considered as being over-provisioned. In addition, the provisioning of the primary actuators 114a-114n may be checked through direct measurement, calculation through monitoring of air or liquid supply, return sensors, air/liquid flow rates, etc.

In addition, or alternatively, other techniques may be employed to determine whether and to what extent the primary actuator 114a-114n families are over-provisioned. For instance, various dimensionless parameters between the temperatures of the sensors 120a-120n, or the heat generating devices, may be used to determine the provisioning levels of the heat generating devices. Suitable dimensionless parameters are disclosed in co-pending and commonly assigned U.S. patent application Ser. No. 10/446,854, filed on May 29, 2003, the disclosure of which is hereby incorporated by reference herein in its entirety.

At step 458, operations of the secondary actuators 232 may be reduced in those primary actuator 114a-114n families determined to be over-provisioned beyond the predefined threshold at step 456. The secondary actuators 232 operations may be respectively reduced according to the level of over-provisioning in each primary actuator 114a-114n family.

At step 460, the sensors 120a-120n and the heat generating devices may be re-commissioned as described above with respect to steps 406 and 408. In addition, it may be determined at step 462 as to whether the VFD settings of the primary actuators 114a-114n are correct at step 462. The determination as to whether the VFD settings are correct may be based upon the provisioning check described hereinabove with respect to step 456. Thus, if it is determined that the VFD settings are not correct or, in other words, that at least one of the primary actuators 114a-114n are provisioned beyond the predefined threshold, step 456 may be performed to determine the extent of over-provisioning in the at least one of the primary actuators 114a-114n. In addition, steps 456-462 may be repeated a number of times or until the VFD settings are determined to be correct, for instance, when the primary actuators 114*a*-114*n* are not provisioned beyond the predefined threshold.

Following correct VFD settings of the primary actuator 114*a*-114*n* family members at step 462, steps 412-420 may be performed to set the SAT setpoints for the secondary actuators 234 as described above.

Although not shown in FIG. 4B, steps 454, 406, 408, and 456-462 may be substantially periodically repeated, for instance, if new equipment is installed in the data center 100, if vent tiles 118 have been moved, if equipment has been moved or re-oriented, if heat generating devices have been removed or replaced, etc. Steps 454, 406, 408, and 456-462 may also be periodically repeated in response to a manual instruction to perform these steps, following passage of a predetermined period of time, etc.

According to another example, some or all of the steps contained in the method 450 may be performed on a zonal basis as also described above with respect to the method 400. In this example, step 408 may additionally include the step of assigning the primary actuators 114*a*-114*n* into one or more zones.

In addition, steps 456-462 may be performed according to respective zones in which the primary actuators 114*a*-114*n* are assigned. Moreover, steps 412-420 may be performed in much the same way as described above and is thus not repeated here.

The operations set forth in the methods 300, 400 and 450 may be contained as a utility, program, or subprogram, in any desired computer accessible medium. In addition, the methods 300, 400 and 450 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
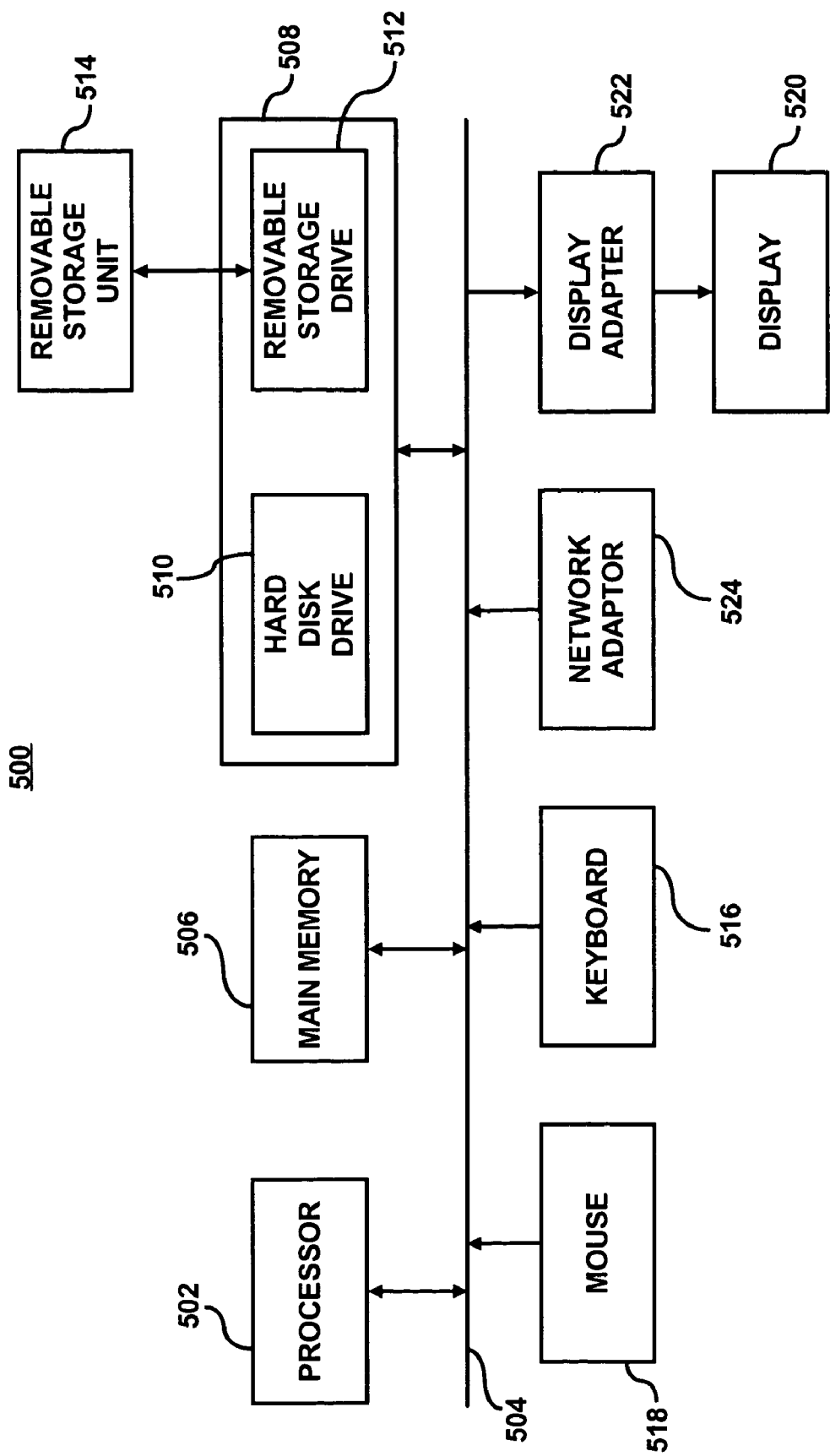
FIG. 5 illustrates a computer system, which may be employed to perform the various functions of the cooling provisioning system of FIG. 2, according to an embodiment of the invention.

FIG. 5 illustrates a computer system 500, which may be employed to perform the various functions of the controller 130 described hereinabove, according to an embodiment. In this respect, the computer system 500 may be used as a platform for executing one or more of the functions described hereinabove with respect to the controller 130.

The computer system 500 includes one or more controllers, such as a processor 502. The processor 502 may be used to execute some or all of the steps described in the methods 300, 400 and 450. Commands and data from the processor 502 are communicated over a communication bus 504. The computer system 500 also includes a main memory 506, such as a random access memory (RAM), where the program code for, for instance, the controller 130, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the cooling provisioning system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for controlling cooling provisioning for heat generating devices, said method comprising:

correlating the heat generating devices with primary actuators to identify which of the primary actuators have at least a predetermined level of influence over which of the heat generating devices and assigning the heat generating devices to one or more primary actuator families based upon the correlations;

setting flow rates of air supplied by the primary actuators based upon volume flow rate requirements of the heat generating devices, wherein the volume flow rate settings for one or more of the a primary actuators is based upon the volume flow rate requirement for the heat generating devices associated with respective ones of the one or more primary actuator families; and varying temperatures of the airflow supplied by the primary actuators while maintaining the flow rates of the airflow at the set flow rates to substantially maintain associated heat generating devices within predetermined temperature ranges.

2. The method according to claim 1, further comprising: commissioning sensors with the primary actuators, such that the sensors are each in at least one of the primary actuator families; and wherein the step of correlating the heat generating devices with the primary actuators further comprises correlating the heat generating devices with the commissioned sensors to correlate each of the heat generating devices with the primary actuators.

3. The method according to claim 2, further comprising: for each primary actuator family, choosing a control sensor of the sensors, wherein the step of choosing a control sensor comprises choosing as the control sensor, the sensor having the highest temperature above a setpoint temperature, and if none of the sensors have a temperature above the setpoint temperature, choosing as the control sensor, either the sensor having the lowest temperature below the setpoint temperature or the sensor having the highest temperature below the setpoint temperature.

4. The method according to claim 3, further comprising:
in each control sensor, determining a level of difference between a measured temperature and a predefined temperature and transmitting an error signal corresponding to the difference; and
wherein the step of varying temperatures further comprises manipulating secondary actuators of the primary actuators to vary the temperatures according to the error signals transmitted by the control sensors in respective primary actuator families to thereby substantially maintain the heat generating devices in each primary actuator family within predetermined temperature ranges.

5. The method according to claim 4, further comprising:
repeating the step of choosing a control sensor for each primary actuator family and the step of varying temperatures as error signals are transmitted by the control sensors.

6. The method according to claim 4, wherein the step of correlating further comprises assigning the primary actuator families into at least one zone, and wherein the step of choosing the control sensor further comprises choosing the sensor having the highest temperature above the setpoint temperature for each zone, and if none of the sensors have a temperature above the setpoint temperature for each zone, choosing as the control sensor, either the sensor having the lowest temperature below the setpoint temperature or the sensor having the highest temperature below the setpoint temperature for each zone.

7. The method according to claim 6, wherein the step of varying temperatures further comprises manipulating secondary actuators to vary the temperatures according to the error signals transmitted by the control sensors in respective zones to thereby substantially maintain the heat generating devices in each zone within predetermined temperature ranges.

8. The method according to claim 1, further comprising:
determining recommended airflow volumes for the heat generating devices; and
wherein the step of setting the flow rates of air supplied by the primary actuators further comprises setting the primary actuators to supply air to their respective associated heat generating devices at the recommended airflow volumes.

9. The method according to claim 1, wherein the step of setting flow rates of air supplied by the primary actuators further comprises iteratively setting the flow rates of air supplied by the primary actuators and correlating the heat generating devices with the primary actuators at the iterated flow rates until the primary actuators are operating at levels below a predefined threshold.

10. The method according to claim 9, wherein the step of correlating the heat generating devices with primary actuators further comprises assigning the heat generating devices to the associated primary actuator families and wherein the step of iteratively setting the flow rates of air supplied by the primary actuators further comprises:
(a) determining extents to which each primary actuator family is over-provisioned;
(b) reducing flow rates of air supplied by primary actuators in those primary actuator families determined to be over-provisioned beyond a predefined threshold;
(c) re-correlating and re-assigning the heat generating devices with primary actuator families; and
(d) determining whether the primary actuators are operating at levels below the predefined threshold.

11. The method according to claim 10, further comprising:
(e) repeating steps (a)-(d) in response to a determination that at least one of the primary actuators is operating at a level above the predefined threshold; and
(f) repeating steps (a)-(d) until it is determined that the primary actuators are operating at levels below the predefined threshold.

12. The method according to claim 11, further comprising:
periodically performing steps (a)-(f) in response to at least one of a passage of a predetermined period of time, manual instructions, and a change in equipment location or configuration.

13. The method according to claim 1, wherein the step of correlating the heat generating devices with primary actuators further comprises employing at least one of extrapolation and modeling techniques to correlate the heat generating devices with the primary actuators.

14. A system for controlling cooling provisioning for heat generating devices, said system comprising:
primary actuators configured to vary cooling provisioning for the heat generating devices; and
a controller configured to implement at least one algorithm configured to:
assign each of the heat generating devices to at least one of a plurality of primary actuator families according to correlations between the heat generating devices and the primary actuators;
set the primary actuators to supply air at volumes based upon the heat generating devices respectively contained in the primary actuator families, and
manipulate the primary actuators to vary the temperatures of the airflow supplied by the primary actuators while maintaining the flow rates of the airflow at the set flow rates to substantially maintain heat generating devices in the respective primary actuator families within predetermined temperature ranges.

15. The system according to claim 14, further comprising:
sensors positioned with respect to at least one of the heat generating devices and at least one of the primary actuators; and
wherein the controller is further configured to assign each of the sensors to at least one primary actuator family according to correlations between the sensors and the primary actuators.

16. The system according to claim 14, wherein the controller is further configured to choose a control sensor for each of the primary actuator families, wherein the control sensor for each of the primary actuator families comprises the sensor having the highest temperature above a setpoint temperature, and if none of the sensors have a temperature above the setpoint temperature, the controller is configured to choose as the control sensor, either the sensor having the lowest temperature below the setpoint temperature or the sensor having the highest temperature below the setpoint temperature.

17. The system according to claim 16, wherein the controller is further configured to implement algorithms for assigning the primary actuators into at least one zone and for choosing as a control sensor for each zone, the sensor having the highest temperature above the setpoint temperature, and if none of the sensors have a temperature above the setpoint temperature, choosing as the control sensor, either the sensor having the lowest temperature below the setpoint temperature or the sensor having the highest temperature below the setpoint temperature.

18. The system according to claim 14, wherein each of the primary actuators comprises secondary actuators, said secondary actuators comprising:
   a device for controlling supply airflow volume, wherein the controller is configured to control the device for controlling supply airflow volume to set the primary actuators to supply air at volumes based upon the heat generating devices contained in the primary actuator families; and
   a device for controlling supply airflow temperature, wherein the controller is configured to control the device for controlling supply airflow temperature to vary the temperatures of the airflow supplied by the primary actuators.

19. The system according to claim 14, wherein the controller is further configured to set the flow rates of air supplied by the primary actuators based upon recommended airflow volumes for the heat generating devices.

20. The system according to claim 19, wherein the recommended airflow volumes comprise at least one of airflow volumes recommended by manufacturers of components housed in the heat generating devices and acceptable airflow volumes determined through testing.

21. The system according to claim 14, wherein the controller is further configured to implement algorithms to iteratively set the flow rates of the air supplied by the primary actuators and to reassign the heat generating devices to the primary actuator families at the iterated flow rates until the primary actuators are operating at levels below a predefined threshold.

22. The system according to claim 21, wherein the controller is further configured to implement algorithms for:
   (a) determining extents to which each primary actuator family is over-provisioned;
   (b) reducing flow rates of air supplied by primary actuators in those primary actuator families determined to be over-provisioned beyond a predefined threshold;
   (c) re-correlating and re-assigning the heat generating devices with primary actuator families;
   (d) determining whether the primary actuators are operating at levels below the predefined threshold;
   (e) repeating steps (a)-(d) in response to a determination that at least one of the primary actuators is operating at a level above the predefined threshold; and
   (f) repeating steps (a)-(e) until it is determined that the primary actuators are operating at levels below the predefined threshold.

23. A system comprising:
   means for assigning heat generating devices to at least one primary actuator family, each primary actuator family having a primary actuator;
   means for setting flow rates of air supplied by the primary actuators based upon volume flow rate requirements of the heat generating devices, wherein the volume flow rate setting for a primary actuator is based upon the volume flow rate requirement for the heat generating devices associated with the primary actuator; and
   means for varying temperatures of the airflow supplied by the primary actuators while maintaining the flow rates of airflow at the set flow rates to substantially maintain heat generating devices in each of the at least one primary actuator family within predetermined temperature ranges.

24. A computer readable storage medium on which is embedded one or more computer programs, said one or more computer programs implementing a method for controlling cooling provisioning for heat generating devices, said one or more computer programs comprising a set of instructions for:
   assigning the heat generating devices to primary actuator families, such that each of the heat generating devices is assigned to a primary actuator family including a primary actuator having at least a predefined level of influence over the respective heat generating devices;
   setting flow rates of air supplied by the primary actuators based upon volume flow rate requirements of the heat generating devices, wherein the volume flow rate setting for a primary actuator is based upon the volume flow rate requirement for the heat generating devices associated with the primary actuator; and
   varying temperatures of the airflow supplied by the primary actuators while maintaining the flow rates of the airflow at the set flow rates to substantially maintain associated heat generating devices within predetermined temperature ranges.

* * * * *

UNITED STATES PATENT AND TRADEMARK OFFICE
CERTIFICATE OF CORRECTION

PATENT NO.        : 7,669,431 B2
APPLICATION NO. : 11/101238
DATED             : March 2, 2010
INVENTOR(S)       : Cullen E. Bash et al.

It is certified that error appears in the above-identified patent and that said Letters Patent is hereby corrected as shown below:

In column 18, line 46, in Claim 1, delete "the a" and insert -- the --, therefor.

In column 20, line 37, in Claim 14, delete "families ," and insert -- families; --, therefor.

Signed and Sealed this

Fifth Day of October, 2010

David J. Kappos
*Director of the United States Patent and Trademark Office*